(12) United States Patent
Li et al.

(10) Patent No.: US 9,891,351 B2
(45) Date of Patent: Feb. 13, 2018

(54) DISPLAY SUBSTRATE, FABRICATION METHOD AND DISPLAY APPARATUS

(71) Applicant: BOE TECHNOLOGY GROUP CO., LTD., Beijing (CN)

(72) Inventors: Wusheng Li, Beijing (CN); Ki Man Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 18 days.

(21) Appl. No.: 15/032,259

(22) PCT Filed: Sep. 18, 2015

(86) PCT No.: PCT/CN2015/089926
§ 371 (c)(1),
(2) Date: Apr. 26, 2016

(87) PCT Pub. No.: WO2016/127643
PCT Pub. Date: Aug. 18, 2016

(65) Prior Publication Data
US 2016/0356928 A1 Dec. 8, 2016

(30) Foreign Application Priority Data
Feb. 12, 2015 (CN) .......................... 2015 1 0075788

(51) Int. Cl.
*G02B 5/02* (2006.01)
*G06F 3/041* (2006.01)
(Continued)

(52) U.S. Cl.
CPC ............ *G02B 5/021* (2013.01); *B05D 1/005* (2013.01); *G02B 1/14* (2015.01); *G02B 5/02* (2013.01);
(Continued)

(58) Field of Classification Search
CPC .... G02B 5/021; G02B 5/0215; G02B 5/0221; G02B 5/0226; G02B 5/0268; G02B 1/14;
(Continued)

(56) References Cited

U.S. PATENT DOCUMENTS

| 2008/0055581 A1* | 3/2008 | Rogers .................. B82Y 10/00 |
| | | 355/95 |
| 2011/0177300 A1* | 7/2011 | Hankey ................... G02B 5/26 |
| | | 428/189 |

(Continued)

FOREIGN PATENT DOCUMENTS

| CN | 103176637 A | 6/2013 |
| CN | 103336605 A | 10/2013 |

(Continued)

OTHER PUBLICATIONS

State Intellectual Property Office of the P.R.C (SIPO) Office Action 1 for 201510075788.7 Aug. 23, 2016 8 Pages.
(Continued)

*Primary Examiner* — William R Alexander
(74) *Attorney, Agent, or Firm* — Anova Law Group, PLLC (57) ABSTRACT

The present disclosure provides a display substrate. The display substrate includes a substrate having a display area and a border area surrounding the display area; a non-black photo-resist layer formed on the substrate in the border area; and a black photo-resist layer formed on the non-black photo-resist layer. The non-black photo-resist layer interfaces the black photo-resist layer with a diffusion structure.

20 Claims, 6 Drawing Sheets (51) Int. Cl.
*G02B 1/14* (2015.01)
*B05D 1/00* (2006.01)
*G03F 7/20* (2006.01)
*H05K 1/02* (2006.01)

(52) U.S. Cl.
CPC .......... *G02B 5/0215* (2013.01); *G02B 5/0221* (2013.01); *G02B 5/0226* (2013.01); *G02B 5/0268* (2013.01); *G03F 7/70025* (2013.01); *G06F 3/041* (2013.01); *G06F 3/0412* (2013.01); *G06F 2203/04102* (2013.01); *H05K 1/028* (2013.01); *H05K 2201/05* (2013.01)

(58) Field of Classification Search
CPC ....... G02B 5/02; B05D 1/005; G03F 7/70025; G06F 3/041; G06F 3/0412
USPC .......................................................... 359/599
See application file for complete search history.

(56) References Cited

U.S. PATENT DOCUMENTS

| | | | |
|---|---|---|---|
| 2013/0063968 A1* | 3/2013 | Neugebauer | G02B 6/0043 362/603 |
| 2013/0082961 A1* | 4/2013 | Wang | G06F 3/044 345/173 |
| 2013/0265253 A1* | 10/2013 | Lin | G06F 3/041 345/173 |
| 2014/0078419 A1 | 3/2014 | Lin et al. | |
| 2014/0300835 A1* | 10/2014 | Chu | G06F 3/0412 349/12 |
| 2014/0340364 A1* | 11/2014 | Tang | G06F 3/042 345/175 |
| 2016/0154492 A1* | 6/2016 | Luo | G06F 3/041 345/173 |

FOREIGN PATENT DOCUMENTS

| | | |
|---|---|---|
| CN | 103365453 A | 10/2013 |
| CN | 203376704 U | 1/2014 |
| CN | 203552213 U | 4/2014 |
| CN | 204044781 U | 12/2014 |
| CN | 104700721 A | 6/2015 |

OTHER PUBLICATIONS

State Intellectual Property Office of the P.R.C (SIPO) Office Action 2 for 201510075788.7 Mar. 1, 2017 9 Pages.
The World Intellectual Property Organization (WIPO) International Search Report and Written Opinion for PCT/CN2015/089926 Dec. 11, 2015 5 Pages.

* cited by examiner

DISPLAY SUBSTRATE, FABRICATION METHOD AND DISPLAY APPARATUS

CROSS-REFERENCES TO RELATED APPLICATIONS

This application is a national phase entry under 35 U.S.C. § 371 of International Application No. PCT/CN2015/089926, filed on Sep. 18, 2015, which claims priority to Chinese Patent Application No. CN201510075788.7, filed on Feb. 12, 2015. The above enumerated patent applications are incorporated by reference herein in their entirety.

FIELD OF THE DISCLOSURE

The present disclosure generally relates to the field of display technologies and, more particularly, relates to a display substrate, fabrication method and display apparatus thereof.

BACKGROUND

Flat panel displays are widely used in our daily life. An important part of flat panel displays is the display substrate. A conventional display substrate usually includes a transparent substrate and a cover layer. The transparent substrate is divided into a display area and a border area, and the display area is surrounded by the border area. The cover layer is disposed in the border area, and is used primarily for covering signal lines and providing a decorative or protective function.

For producing different product appearances, the border area is required to be black or non-black. When the photo-resist layer is formed on the transparent substrate using a black photo-resist layer, the border area looks black. When the cover layer is formed on the transparent substrate using a black photo-resist layer and a non-black photo-resist layer, and the non-black photo-resist layer is disposed between the black photo-resist layer and the transparent substrate, the non-black photo-resist layer blocks the color of the black photo-resist layer from appearing and makes the border area appear non-black.

However, according to the present disclosure, if the non-black photo-resist layer is not thick enough, the color of the border area becomes too dark. This is especially evident for white border area, which may appear greenish, and the decorative effect can be affected. On the other hand, if the non-black photo-resist layer is sufficiently thick, the entire cover layer may become too thick. Further, the signal lines crossing the boundary between the display area and the border area are likely to break if the cover layer is too thick.

BRIEF SUMMARY OF THE DISCLOSURE

Directed to at least alleviate one or more problems set forth above and other problems in the art, the present disclosure provides a display substrate, fabrication method and display apparatus thereof to improve the production yield for display substrates with non-black border area.

One aspect of the present disclosure provides a display substrate. The display substrate includes a substrate having a display area and a border area surrounding the display area; a non-black photo-resist layer formed on the substrate in the border area; and a black photo-resist layer formed on the non-black photo-resist layer. The non-black photo-resist layer interfaces the black photo-resist layer with a diffusion structure.

Optionally, the diffusion structure includes a plurality of protrusion structures formed on a surface of the non-black photo-resist layer facing the black photo-resist layer.

Optionally, the diffusion structure is formed in the surface of the non-black photo-resist layer to be an integrated structure of the non-black photo-resist layer.

Optionally, the diffusion structure and the non-black photo-resist layer are two layers of independent structures.

Optionally, the protrusion structures have nanoscale protrusion patterns.

Optionally, the protrusion structures are irregular patterns.

Optionally, the protrusion structures are regular patterns of a plurality of parallel triangular stripes.

Optionally, the diffusion structure includes a plurality of reflective particles formed on a surface of the non-black photo-resist layer facing the black photo-resist layer by spray-coating or spin-coating.

Optionally, the diffusion layer includes at least light-transmissive adhesive, stabilizer, and reflective particles; and the reflective particles are made of one or more materials of titanium oxide, aluminum oxide, halogen-containing phosphate, calcium pyrophosphate, and strontium pyrophosphate, and having a size in a range of approximately 100 nm~200 nm.

Optionally, the display substrate is a one glass solution substrate; the one glass solution substrate also includes an electrode layer; and the electrode layer is formed in the display area of the substrate and extended onto the black photo-resist layer in the border area of the substrate.

Optionally, the diffusion structure has a thickness of approximately 0.3 μm to 0.7 μm.

Optionally, the non-black photo-resist layer has a thickness of approximately 10 μm to 13 μm.

Optionally, the non-black photo-resist layer has a thickness of approximately 10 μm to 12 μm.

Optionally, the display substrate also includes a protective layer formed on the electrode layer.

Another aspect of the present disclosure provides a display apparatus, including the above disclosed display substrate.

Another aspect of the present disclosure provides a method of fabricating the display substrate. The method includes providing a substrate having a display area and a border area surrounding the display area; and forming a non-black photo-resist layer and a black photo-resist layer in the border area of the substrate, wherein a diffusion structure is formed on an interface between the non-black photo-resist layer and the black photo-resist layer.

Optionally, forming the non-black photo-resist layer and the black photo-resist layer further includes forming the non-black photo-resist layer in the border area of the substrate; forming a diffusion structure on the non-black photo-resist layer; and forming a black photo-resist layer on the diffusion structure.

Optionally, the diffusion structure is formed in a surface of the non-black photo-resist layer facing the black photo-resist layer or in a surface of the black photo-resist layer facing the non-black photo-resist layer by using a Nanoimprint lithographic method or a laser interference lithographic method.

Optionally, the diffusion structure includes a plurality of reflective particles formed on a surface of the non-black photo-resist layer facing the black photo-resist layer by spray-coating or spin-coating.

Optionally, the fabrication method further includes forming an electrode layer on the substrate, wherein the electrode layer is formed in the display area of the substrate and is extended onto the black photo-resist layer in the border area of the substrate; and forming a protective layer on the electrode layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the invention.

Figure 1:
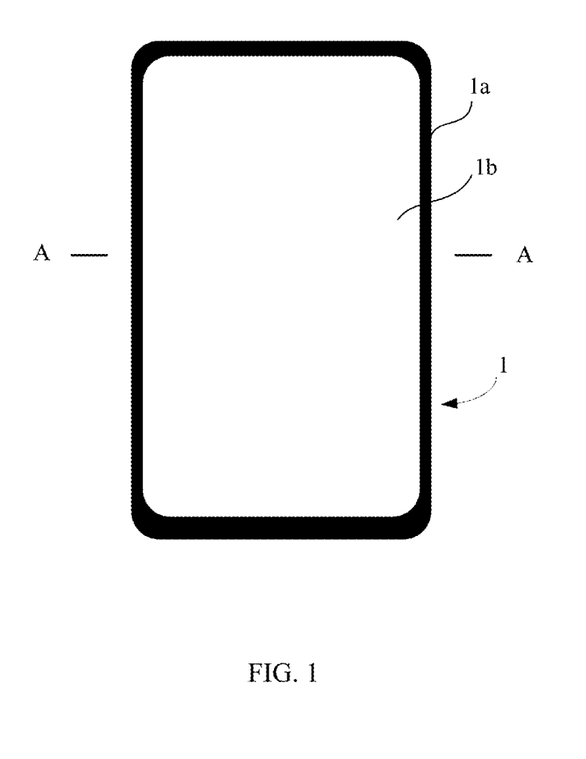
FIG. 1 illustrates a top-down schematic view of an exemplary display substrate according to disclosed embodiments.

As shown in FIG. 1, the present disclosure provides an exemplary display substrate. The display substrate includes a substrate 1. The substrate 1 may include any appropriate type of substrate. For example, the substrate 1 may be transparent, translucent, or non-transparent substrate. The substrate 1 may include transmissive device, reflective device, and electronic paper, etc. Further, the substrate 1 is divided into a border area 1a and a display area 1b. The display area 1b is surrounded by the border area 1a. The border area 1a appears black, although other non-black color may also be used.

Figure 2:
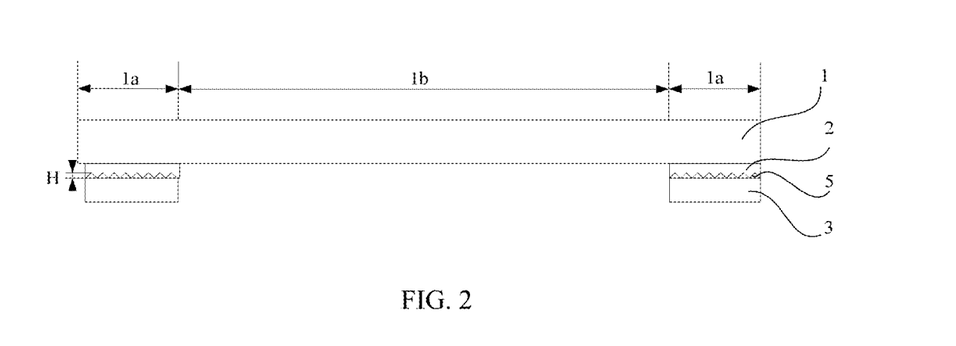
FIG. 2 illustrates a cross-sectional schematic view of an exemplary display substrate along A-A line in FIG. 1 according to disclosed embodiments.

FIG. 2 illustrates a cross-sectional schematic view of the display substrate shown in FIG. 1 along A-A line. As shown in FIG. 2, the display substrate includes a non-black photo-resist layer 2 and a black photo-resist layer 3. A photo-resist layer, as used herein, refers to a layer made of any appropriate material for blocking passage of light. For example, the photo-resist layer may be a photoresist layer or may be a paint, resin, or glue layer. Under certain circumstance, e.g., when the black photoresist layer is used to cover electrodes or other metal wiring, the black photoresist layer may also be called a black matrix, and the non-black photoresist layer may be called a white matrix.

The non-black photo-resist layer 2 and the black photo-resist layer 3 may sequentially formed on the substrate 1 in the border area 1a. A diffusion structure 5 is configured between the contacting surfaces of the non-black photo-resist layer 2 and the black photo-resist layer 3. The diffusion structure 5 may have a thickness or height of H.

The non-black photo-resist layer 2 and the black photo-resist layer 3 may be referred as a cover layer for the display substrate. Although one non-black photo-resist layer 2 and one black photo-resist layer 3 are used for illustrative purposes, the cover layer may include any number of non-black photo-resist layer 2 and/or any number of black photo-resist layer 3.

Figure 3A:
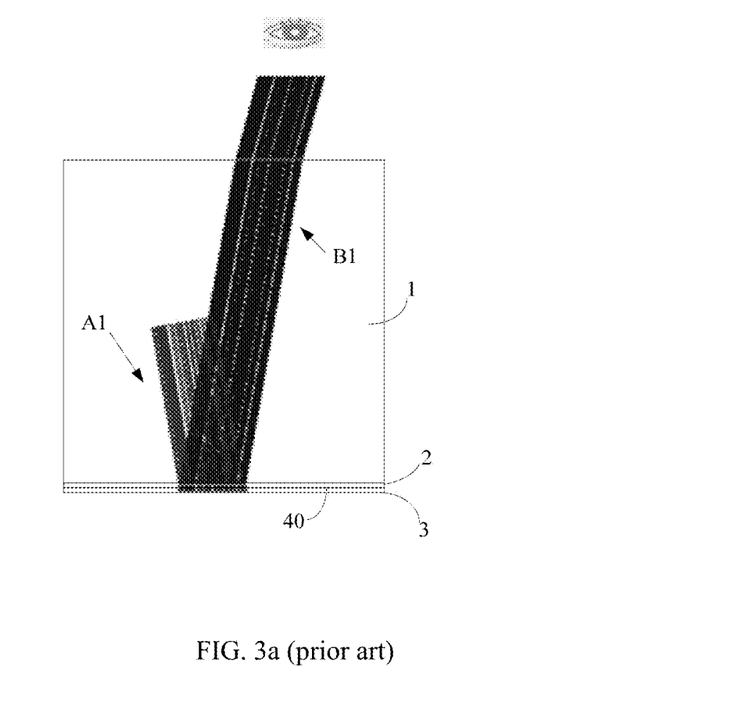
FIG. 3a illustrates a light reflection effect under an incident condition in a conventional display substrate.
Figure 3B:
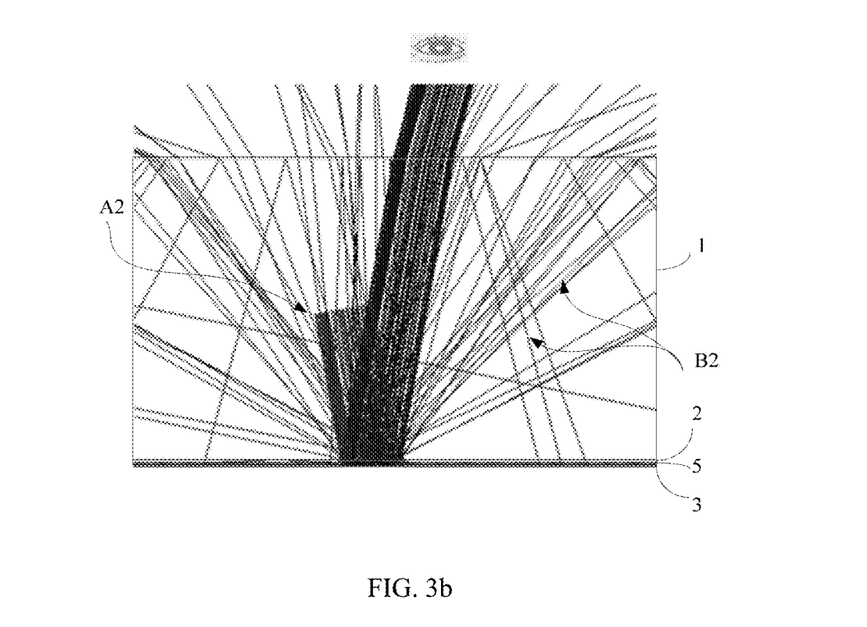
FIG. 3b illustrates a light reflection effect under the same incident condition as in FIG. 3a according to disclosed embodiments.

FIGS. 3a and 3b illustrate the reflection effect of incident light with a conventional cover layer and with a disclosed cover layer, respectively. The light incident condition (including incident angle and light intensity) is the same for both, and the structures are also similar, both including a substrate 1, non-black photo-resist layer 2, and black photo-resist layer 3. However, in FIG. 3b, diffusion structure 5 is disposed between the contacting surfaces of the non-black photo-resist layer 2 and the black photo-resist layer 3, while there is none in FIG. 3a.

Figure 3C:
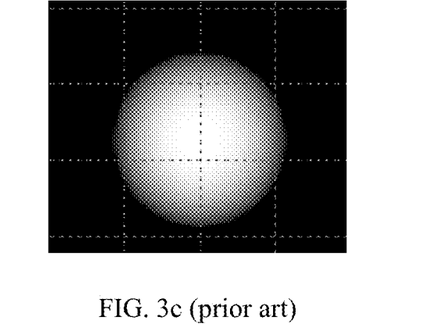
FIG. 3c illustrates a color effect perceived by human eyes under the same incident condition as in FIG. 3a in a conventional display substrate.

As shown in FIG. 3a, the incident light A1 enters the substrate 1, and is reflected at the interface 40 between the contacting surfaces of the non-black photo-resist layer 2 and the black photo-resist layer 3. All reflected light B1 exits in a same direction, i.e., without any diffusion. Thus, a darker color of the black photo-resist layer 3 is seen by human eyes, as shown in FIG. 3c.

Figure 3D:
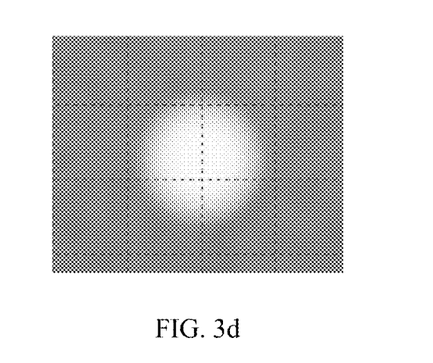
FIG. 3d illustrates a color effect perceived by human eyes under the same incident condition as in FIG. 3a according to disclosed embodiments.

As shown in FIG. 3b, in one embodiment, the incident light A2 enter the substrate 1 under the same condition as A1, and is also reflected at the interface between the contacting surfaces of the non-black photo-resist layer 2 and the black photo-resist layer 3. However, because the existence of the diffusion structure 5, the incident light A2 is also diffused by the diffusion structure 5 at the same as being reflected by the interface between the non-black photo-resist layer 2 and the black photo-resist layer 3. The reflected and diffused light B2 exits in nearly random directions. Thus, a lighter color of the black photo-resist layer 3 is seen by human eyes, as shown in FIG. 3d.

Thus, as previously described, by providing a diffusion structure 5 on the interface between the non-black photo-resist layer 2 and the black photo-resist layer 3, the external incident light enters the substrate 1, passes through the non-black photo-resist layer 2 and reaches the diffusion structure 5. The diffusion structure 5 reduces the reflectivity of the surface of the black photo-resist layer 3. When the reflectivity of the black photo-resist layer 3 is reduced, a lighter color of the black photo-resist layer 3 is seen by human eyes. Thus, a relatively thinner non-black photo-resist layer 2 may be sufficient to block the color of the black photo-resist layer 3. Thus, the thickness of the non-black photo-resist layer is reduced, and the thickness of the cover layer in the non-black border area is also reduced.

The display substrate according to the present disclosure may also include other structures generally present in a display substrate, such as pixel electrodes, array substrate, etc., which are not limited by the present disclosure and further description of which is omitted.

In one embodiment, the diffusion structure 5 is formed as a plurality of protrusion structures on the surface of the non-black photo-resist layer 2 facing the black photo-resist layer 3. In other embodiments, the diffusion structure 5 may be a plurality of reflective particles formed on the surface of the non-black photo-resist layer 2 facing the black photo-resist layer 3. That is, the diffusion structure 5 may be a diffusion layer containing the plurality of reflective particles. More specifically, the diffusion layer may include light-transmissive adhesive, stabilizer, and reflective particles, etc. The reflective particles may be made of one or more materials of titanium oxide, aluminum oxide, halogen-containing phosphate, calcium pyrophosphate, and strontium pyrophosphate. The size or diameter of the reflective particles may be in a range of approximately 100 nm~200 nm. The reflective particles may be formed on the surface of the non-black photo-resist layer 2 by spray-coating or spin-coating. Other material, size, or method may also be used.

Further, the plurality of the protrusion structures may be formed with regular or irregular protrusion patterns. For example, a protrusion pattern of a plurality of parallel triangular stripes may form a regular protrusion pattern. The protrusion patterns may be nanoscale patterns. Nanoscale pattern refers to that the dimension of the protrusion structures and the distance between the protrusion structures are both in the order of nanometers. Nanoscale patterns may be more effective in light diffusion, which may further reduce the thickness of the non-black photo-resist layer 3.

In other embodiments, the plurality of the protrusion structures may be formed with irregular patterns as long as the external light is effectively diffused by the plurality of the protrusion structures.

Optionally, the diffusion structure 5 and the non-black photo-resist layer 2 may be formed as one integrated structure. For example, the photolithographic method may be used to form a plurality of protrusion structures directly in the surface of the non-black photo-resist layer 2. Because the photolithographic method used to form the diffusion structures is similar to the fabrication method used to form the non-black photo-resist layer 2 and the black photo-resist layer 3, the fabrication process of the cover layer may be simplified to reduce cost. For another example, a Nanoimprint lithography (described below) may also be used to imprint the diffusion structure 5 in the surface of the non-black photo-resist layer 2.

Optionally, the diffusion structure 5 and the non-black photo-resist layer 2 may be formed as two layers of independent structures. In other words, the diffusion structure 5 is formed as the plurality of the protrusion structures between the contact surfaces of the non-black photo-resist layer 2 and the black photo-resist layer 3. The plurality of the protrusion structures may be formed by using photoresist, e.g., using the Nanoimprint lithography described below.

The diffusion structure 5 may have a thickness of approximately 0.3 μm to 0.7 μm, preferably at about 0.5 μm. The thickness of the diffusion structure 5 is the height of the protrusion structures in the thickness direction of the display substrate or H, as shown in FIG. 2. When the height of the diffusion structure 5 is set at about 0.5 μm, desired diffusion effect may be achieved.

Alternatively and additionally, the diffusion structure 5 may be formed on the surface of the black photo-resist layer 3 facing the non-black photo-resist layer 2 as a separate structure, or formed in the surface of the black photo-resist layer 3 facing the non-black photo-resist layer 2 as an integrated structure. Further, the diffusion structure 5 may be formed as integrated structures in both contacting surfaces of the non-black photo-resist layer 2 and the black photo-resist layer 3.

Figure 4:
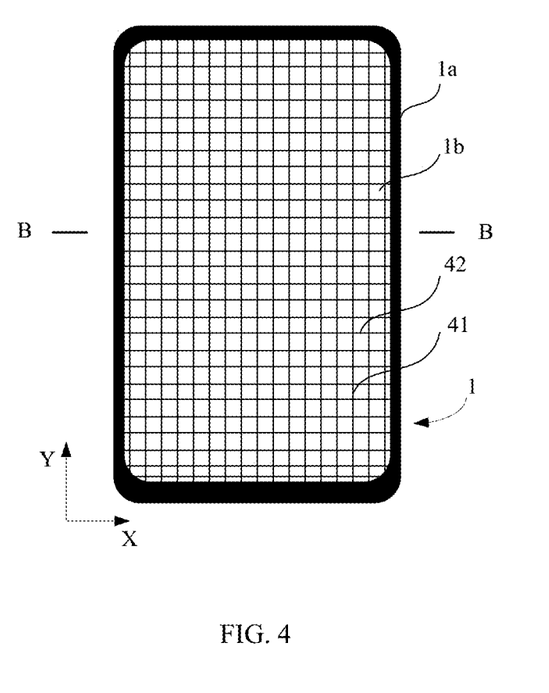
FIG. 4 illustrates a top-down schematic view of another exemplary display substrate according to disclosed embodiments.

According to the present disclosure, another exemplary display substrate is provided. In one embodiment, the display substrate provided may be a one glass solution (OGS) display substrate. As shown in FIG. 4, the display substrate includes a substrate 1. The substrate 1 is divided into a border area 1a and a display area 1b. The display area 1b is surrounded by the border area 1a.

Figure 5:
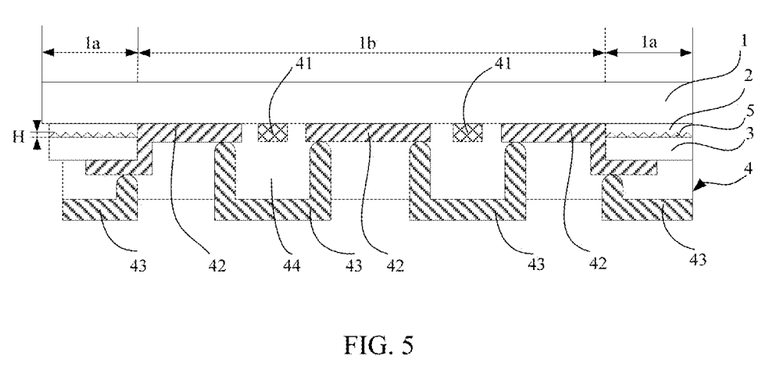
FIG. 5 illustrates a cross-sectional schematic view of another exemplary display substrate along B-B line in FIG. 4 according to disclosed embodiments.

The display substrate also includes a plurality of electrodes arranged in different direction, including first direction electrodes 41 and second direction electrodes 42. FIG. 5 illustrates a cross-sectional schematic view of the display substrate shown in FIG. 4 in X direction along B-B line.

As shown in FIG. 5, the display substrate also includes a non-black photo-resist layer 2, a black photo-resist layer 3 and an electrode layer 4. The non-black photo-resist layer 2 and the black photo-resist layer 3 may be sequentially formed on the substrate 1 in the border area 1a. A diffusion structure 5 is formed on the interface between the non-black photo-resist layer 2 and the black photo-resist layer 3. The electrode layer 4 may be formed on the substrate 1 in the display area 1b and is extended onto the black photo-resist layer 3 in the border area 1a of the substrate 1.

In one embodiment, the diffusion structure 5 may be formed on the interface between the non-black photo-resist layer 2 and the black photo-resist layer 3. External incident light enters the substrate 1, passes through the non-black photo-resist layer 3 and reaches the diffusion structure 5 to be diffused. Thus, the diffusion structure 5 reduces the reflectivity of the black photo-resist layer 3.

When the reflectivity of the black photo-resist layer 3 is reduced, a lighter color of the black photo-resist layer 3 is seen by human eyes. A relatively thinner non-black photo-resist layer 2 is sufficient to block the color of the black photo-resist layer 3. Thus, the thickness of the non-black photo-resist layer 2 is reduced. Further, the overall thickness of the cover layer in the non-black border area is reduced.

The electrode layer 4 may have any appropriate electrode layer structure. The structure of the electrode layer 4 is illustrated with examples accompanying FIG. 5. As shown in FIG. 5, the electrode layer 4 includes a plurality of first direction electrodes 41 and a plurality of second direction electrodes 42. The first direction and the second direction are not extended in parallel. As shown in FIG. 4, in one embodiment, the first direction electrodes 41 extend in the direction perpendicular to the direction in which the second direction electrodes 42 extend, i.e., the first direction electrodes 41 intersect the second direction electrodes 42 perpendicularly.

The second direction electrodes 42 may include a plurality of separated conductive blocks. Any two adjacent conductive blocks are connected through a conductive bridge 43. The first direction electrodes 41 and the second direction electrodes 42 are separated by a dielectric layer 44 and hence are electrically insulated. The conductive bridges 43 are made of metal or ITO, i.e., metal bridges or ITO bridges, which are not limited by the present disclosure.

The shapes of the electrodes shown in FIG. 4 are for illustrative purpose only. In practical applications, the conductive blocks may be in a shape of a diamond or other geometrical shapes.

As shown in FIG. 5, on both sides of the substrate 1, the conductive blocks of the second direction electrodes 42 are formed partially in the display area 1b and partially extended into the border area 1a. Due to the presence of the non-black photo-resist layer 2 and the black photo-resist layer 3 in the border area 1a, the conductive blocks extending to the border area 1a may be bent or broken. However, because the presence of the diffusion structure 5 reduces the thickness of the non-black photo-resist layer 2 while the thickness of the black photo-resist layer 3 remains the same, the overall thickness of the non-black photo-resist layer 2 and the black photo-resist layer 3, i.e., the cover layer, is reduced and the conductive blocks less likely to break when crossing the boundary between the display area 1b and the border area 1a.

In one embodiment, the diffusion structure 5 is formed as a plurality of protrusion structures on the surface of the non-black photo-resist layer 2 facing the black photo-resist layer 3. In other embodiments, the diffusion structure 5 may be a plurality of reflective particles formed on the surface of the non-black photo-resist layer 2 facing the black photo-resist layer 3.

Further, the plurality of the protrusion structures may be formed with regular protrusion patterns. For example, a protrusion pattern of a plurality of parallel triangular stripes may form a regular protrusion pattern. The protrusion patterns may be nanoscale patterns. Nanoscale pattern refers to that the dimension of the protrusion structures and the distance between the protrusion structures are both in the order of nanometers. Nanoscale patterns may be more effective in light diffusion, which may further reduce the thickness of the non-black photo-resist layer 3. In other embodiment, the plurality of the protrusion structures may be formed with irregular patterns as long as the external light is effectively diffused.

In one embodiment, the diffusion structure 5 and the non-black photo-resist layer 2 may be formed as one integrated structure. For example, the photolithographic method may be used to form a plurality of protrusion structures directly in the surface of the non-black photo-resist layer 2.

In other embodiments, the diffusion structure 5 and the non-black photo-resist layer 2 may be formed as two layers of independent structures. In other words, the diffusion structure 5 is formed as the plurality of the protrusion structures between the non-black photo-resist layer 2 and the black photo-resist layer 3. The plurality of the protrusion structures may be formed by using photoresist, e.g., using the Nanoimprint lithography described below.

The diffusion structure 5 may have a thickness of approximately 0.3 μm to 0.7 μm, preferably at about 0.5 μm. The thickness of the diffusion structure 5 is the height of the protrusion structures in the thickness direction of the display substrate or H, as shown in FIG. 5. When the height of the diffusion structure 5 is set at about 0.5 μm, desired diffusion effect may be achieved.

The non-black photo-resist layer 2 may have a thickness of approximately 10 μm to 13 μm, preferably at approximately 10 μm to 12 μm. Lab experiments indicate that the electrode layer is less likely to break when crossing the boundary between the border area 1a and the display area 1b when the thickness of the non-black photo-resist layer 2 is approximately between 10 μm and 13 μm. Thus, this may improve the production yield. When the non-black photo-resist layer 2 is formed with a thickness of approximately 10 μm to 12 μm, further assurance may be given that the electrode layer 4 will not break. The black photo-resist layer 3 may have a thickness of about 1 μm, which is sufficient to mask the underneath structures.

The black photo-resist layer 3 is usually made of resin mixed with black pigment, e.g., carbon black uniformly dispersed in the resin. The non-black photo-resist layer 2 is usually made of resin mixed with non-black pigment, e.g., $TiO_2$ white powder uniformly dispersed in the resin. Further, the substrate 1 may be made of glass, such as quartz and tempered glass, or plastic, such as PET (Polyethylene terephthalate), etc.

Figure 6:
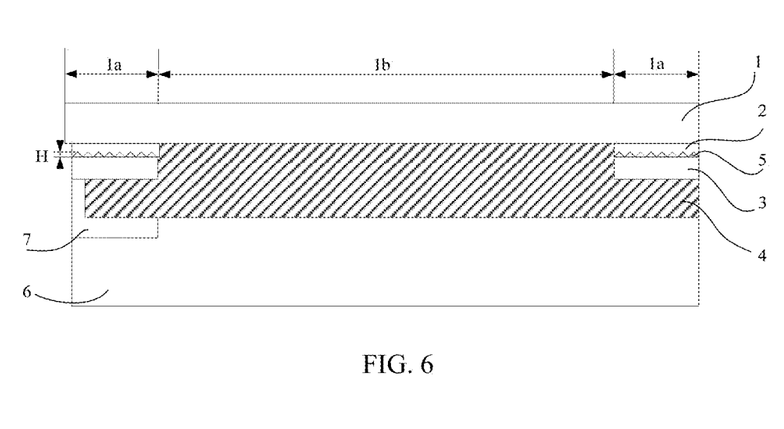
FIG. 6 illustrates a cross-sectional schematic view of another exemplary display substrate according to disclosed embodiments.

According to the present disclosure, another exemplary display substrate is provided. In one embodiment, as shown in FIG. 6, the display substrate also includes a flexible printed circuit (FPC) 7 containing a touch control integrated circuit (IC). The flexible printed circuit 7 is electrically connected to the electrode layer 4. Because other structures may be similar to those shown in FIG. 5, for simplicity, detail structures of the electrode layer 4 are not shown in FIG. 6.

The display substrate may also include a protective layer 6 formed on the electrode layer 4. The protective layer 6 may be made of acrylic resin, silicon nitride, silicon oxide or silicon oxynitride, and may be provide for protecting the display substrate. Other layers of structures, such as a blanking layer, an ITO cover layer, etc., may also be included in the display substrate, which are not limited by the present disclosure.

Figure 7:
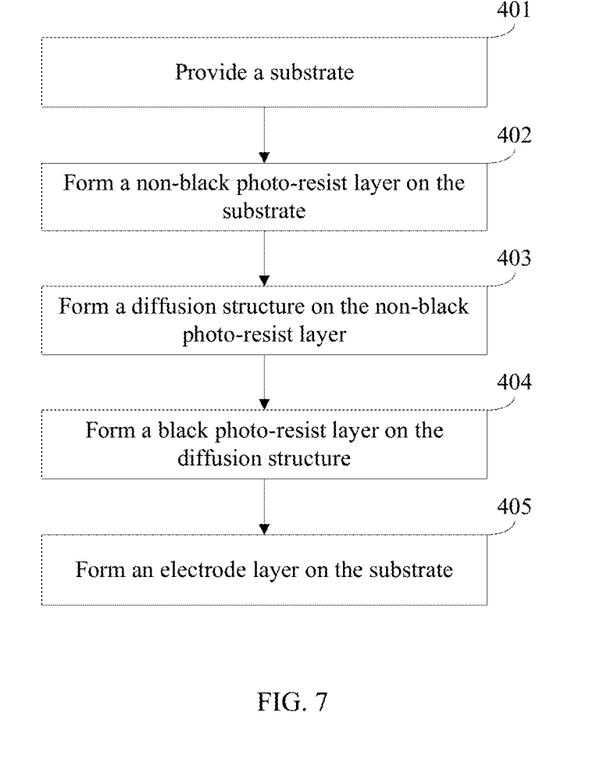
FIG. 7 illustrates a flow chart of a fabrication process of an exemplary display substrate according to disclosed embodiments.

According to the present disclosure, a method of fabricating the disclosed display substrate is provided. As shown in FIG. 7, the fabrication method includes the following steps.

Step 401: providing a substrate. For example, the substrate 1 may be made of glass, such as quartz and tempered glass, or plastic, such as PET (Polyethylene terephthalate), etc. The substrate 1 may include a display area 1b and a border area 1a. The display area 1b is surrounded by the border area 1a.

Step 402: forming a non-black photo-resist layer on the substrate. Specifically, the non-black photo-resist layer may be formed in the border area of the substrate, and a photolithographic process may be used to form the non-black photo-resist layer 2 in the border area 1a on the substrate 1.

Further, in Step 402, a non-black photo-resist material layer may be first formed on the surface of the substrate 1. The non-black photo-resist material layer may be made of photoresist, such as negative photoresist. The non-black photo-resist material layer may then be exposed, developed, and cured sequentially to form the non-black photo-resist layer 2 in the border area 1a. A first mask may be used during the exposure. The first mask may be the same mask used to form the black matrix layer.

Step 403: forming a diffusion structure on the non-black photo-resist layer. The diffusion structure 5 may be formed by using a Nanoimprint lithographic method or the laser interference lithographic method. FIGS. 8a-8d illustrate the Nanoimprint lithographic method for forming the diffusion structure.

Figure 8A:
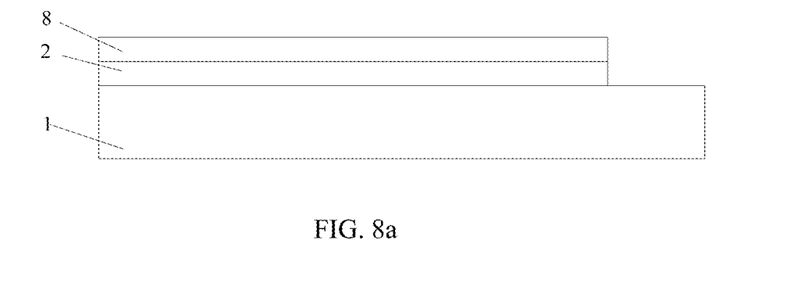
FIGS. 8a-8d illustrate a diffusion structure fabrication process using a Nanoimprint lithographic method according to disclosed embodiments.

As shown in FIG. 8a, a substrate is provided and a non-black photo-resist layer 2 is formed on the substrate. Further, a photoresist layer 8 is formed on the non-black photo-resist layer 2 in the border area 1a. The photoresist layer 8 may be made of UV-curable liquid photopolymer material.

Figure 8B:
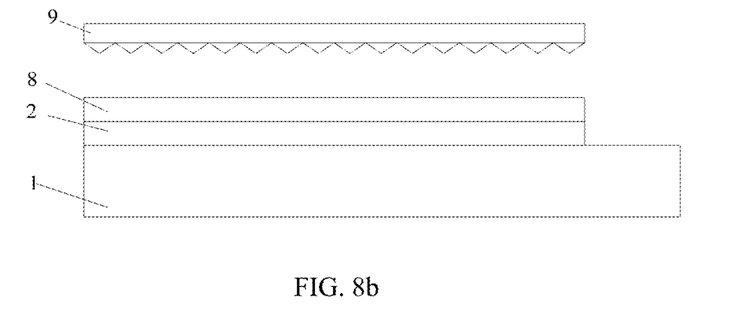

As shown in FIG. 8b, a pattern is imprinted on the photoresist layer 8 by an imprint mold 9. The imprint mold 9 may be made of UV light transparent material such as fused silica or quartz. The imprint mold 9 may have regular or irregular nanoscale patterns. After the imprint mold 9 is pressed onto the photoresist layer 8, the gaps between the imprint mold 9 and the non-black photo-resist layer 2 are fully filled by the photoresist material.

Figure 8C:
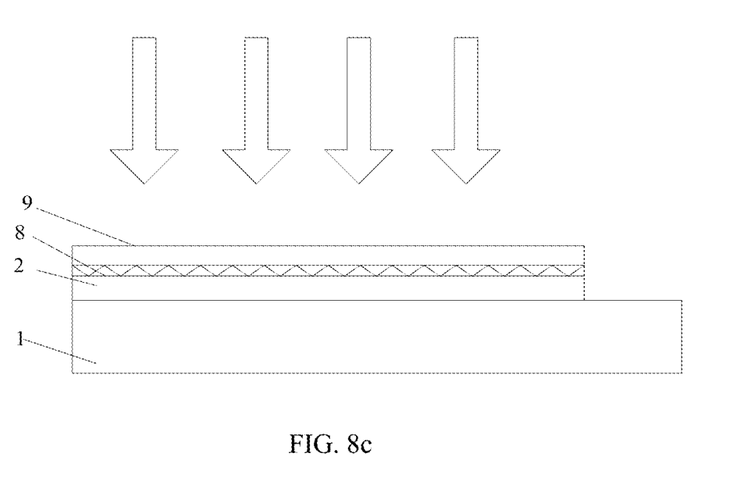

As shown in FIG. 8c, the photoresist layer 8 under the imprint mold 9 is UV cured. When illuminated by a UV lamp, the photoresist layer 8 may be polymerized into a solid layer.

Figure 8D:
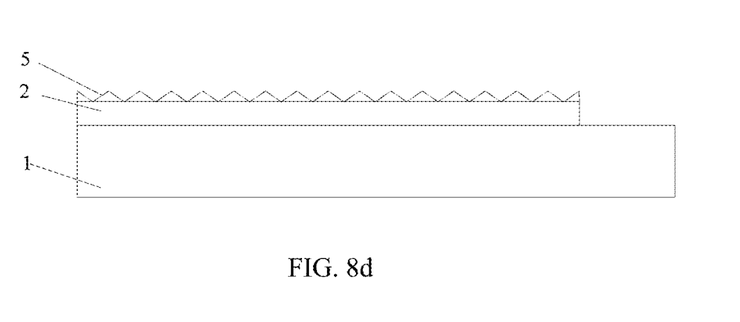

As shown in FIG. 8d, the imprint mold 9 is removed and the diffusion structure 5 is formed. That is, after the imprint mold 9 is separated, the nanoscale patterns on the imprint mold 9 may be transferred to the solid photoresist layer 8. Thus, the protrusion pattern of the diffusion structure 5 formed by using the Nanoimprint lithographic method is determined by the imprint mold 9. The protrusion pattern of the diffusion structure 5 matches the pattern of the imprint mold 9. In one embodiment, the pattern of the imprint mold is an array pattern.

The diffusion structure 5 formed by using the Nanoimprint lithographic method is made of photoresist, which is different from the material of the non-black photo-resist layer 2 (i.e., two layers of independent structures). Alternatively, the laser interference lithographic method may be used to form the pattern of diffusion structure 5 directly in the non-black photo-resist layer 2. In other words, the diffusion structure 5 formed by using the laser interference lithographic method and the non-black photo-resist layer 2 are one integrated structure.

Step 404: forming the black photo-resist layer on the non-black photo-resist layer. Specifically, the lithographic mask process may be used to form the black photo-resist layer 3.

Further, in Step 404, after the diffusion structure 5 is formed, a black photo-resist material layer may be formed on the diffusion structure 5. The black photo-resist material layer may be made of photoresist, such as negative photo-resist. The black photo-resist material layer may be exposed, developed and cured sequentially to form the black photo-resist layer 3. The first mask used in Step 402 may be reused during the exposure.

Optionally, the diffusion structure 5 may be formed as an integrated part of the non-black photo-resist layer 2 or the black photo-resist layer 3. For example, the diffusion structure 5 may be formed in a surface of the non-black photo-resist layer 2 facing the black photo-resist layer 3 or in a surface of the black photo-resist layer 3 facing the non-black photo-resist layer 2 by using a Nanoimprint lithographic method or a laser interference lithographic method. That is, from Steps 402-404, a non-black photo-resist layer and a black photo-resist layer are formed in the border area of the substrate, and a diffusion structure is formed on an interface between the non-black photo-resist layer and the black photo-resist layer.

Further, when the display substrate is a one glass solution (OGS) substrate, the fabrication method may further include the followings.

Step 405: forming an electrode layer on the substrate. The electrode layer may be formed in the display area and may be extended onto the black photo-resist layer in the border area.

Specifically, in Step 405, a vacuum magnetron sputtering process may be used to form a conductive film on the substrate. The conductive film may be coated, exposed, developed, etched and striped, sequentially, to form the graphic pattern such that the first direction electrodes and the plurality of separated conductive blocks of the second direction electrodes are formed.

Further, a dielectric layer 4 may be formed, and a plurality of vias may be formed in the dielectric layer 4 corresponding to the positions of the conductive blocks. A plurality of conductive bridges may be formed on the dielectric layer 4, and the conductive bridges electrically connect the adjacent conductive blocks through the vias in the dielectric layer 4. The conductive film may be made of ITO, and the conductive bridges may be made of either metal or ITO.

Further, the fabrication method may include: forming a protective layer 6 on the electrode layer 4. The protective layer 6 may be made of acrylic resin, silicon nitride, silicon oxide or silicon oxynitride.

Thus, a diffusion structure may be formed on the interface between the non-black photo-resist layer and the black photo-resist layer. External incident light enters the substrate, passes through the non-black photo-resist layer, and reaches the diffusion structure to be diffused. Thus, the diffusion structure reduces the reflectivity of the black photo-resist layer. When the reflectivity of the black photo-resist layer is reduced, a lighter color of the black photo-resist layer is seen by human eyes. A relatively thinner non-black photo-resist layer is sufficient to block the color of the black photo-resist layer. Thus, the thickness of the non-black photo-resist layer is reduced. Further, the overall thickness of the cover layer in the non-black border area is reduced. Further, the lithographic mask process is used in the entire fabrication method, without new process being introduced, further simplifying the fabrication process.

According to the present disclosure, a display apparatus is also provided. The display apparatus includes any of the disclosed display substrates.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A display substrate, comprising:
   a substrate having a display area and a border area surrounding the display area;
   a non-black photo-resist layer formed on the substrate in the border area;
   a black photo-resist layer formed over the non-black photo-resist layer; and
   a diffusion structure including a plurality of reflective particles, formed on a surface of the non-black photo-resist layer facing the black photo-resist by spray-coating or spin-coating.

2. The display substrate of claim 1, wherein:
   the diffusion structure further includes a plurality of protrusion structures formed on a surface of the non-black photo-resist layer facing the black photo-resist layer.

3. The display substrate of claim 2, wherein:
   the diffusion structure is formed on the surface of the non-black photo-resist layer to be an integrated structure of the non-black photo-resist layer.

4. The display substrate of claim 2, wherein:
   the diffusion structure and the non-black photo-resist layer are two layers of independent structures.

5. The display substrate of claim 2, wherein the protrusion structures have nanoscale protrusion patterns.

6. The display substrate of claim 5, wherein the protrusion structures are irregular patterns.

7. The display substrate of claim 5, wherein the protrusion structures are regular patterns of a plurality of triangular stripes, at least one side of one of the triangular stripes being parallel to at least one side of another one of the triangular stripes.

8. The display substrate of claim 1, wherein:
the diffusion structure includes at least one of light-transmissive adhesive, stabilizer, and reflective particles; and
the reflective particles are made of one or more materials of titanium oxide, aluminum oxide, halogen-containing phosphate, calcium pyrophosphate, and strontium pyrophosphate, and having a size in a range of approximately 100 nm~200 nm.

9. The display substrate of claim 1, wherein:
the display substrate is a one glass solution substrate;
the one glass solution substrate also includes an electrode layer; and
the electrode layer is formed in the display area of the substrate and extended onto the black photo-resist layer in the border area of the substrate.

10. The display substrate of claim 1, wherein the diffusion structure has a thickness of approximately 0.3 μm to 0.7 μm.

11. The display substrate of claim 1, wherein the non-black photo-resist layer has a thickness of approximately 10 μm to 13 μm.

12. The display substrate of claim 11, wherein the non-black photo-resist layer has a thickness of approximately 10 μm to 12 μm.

13. The display substrate of claim 9, wherein the display substrate also includes a protective layer formed on the electrode layer.

14. A display apparatus, comprising the display substrate of claim 13.

15. A method of fabricating the display substrate, comprising:
providing a substrate having a display area and a border area surrounding the display area;
forming a non-black photo-resist layer on the substrate in the border area of the substrate;
forming a black photo-resist layer over the non-black photo-resist layer; and
forming a diffusion structure including a plurality of reflective particles on a surface of the non-black photo-resist layer facing the black photo-resist layer by spray-coating or spin-coating.

16. The method of claim 15, further including:
forming an electrode layer on the substrate, wherein the electrode layer is formed in the display area of the substrate and is extended onto the black photo-resist layer in the border area of the substrate; and
forming a protective layer on the electrode layer.

17. A display substrate, comprising:
a substrate having a display area and a border area surrounding the display area;
a non-black photo-resist layer formed on the substrate in the border area;
a black photo-resist layer formed over the non-black photo-resist layer; and
a diffusion structure including a plurality of protrusion structures, formed on a surface of the non-black photo-resist layer facing the black photo-resist layer,
wherein the diffusion structure and the non-back photo-resist layer are two layers of independent structures.

18. The display substrate of claim 17, wherein the protrusion structures have nanoscale protrusion patterns.

19. The display substrate of claim 17, wherein the protrusion structures are irregular patterns.

20. The display substrate of claim 17, wherein the protrusion structures are regular patterns of a plurality of triangular stripes, at least one side of one of the triangular stripes being parallel to at least one side of another one of the triangular stripes.

* * * * *